United States Patent
Zevulun et al.

(10) Patent No.: US 10,171,103 B1
(45) Date of Patent: Jan. 1, 2019

(54) HARDWARE DATA COMPRESSION ARCHITECTURE INCLUDING SHIFT REGISTER AND METHOD THEREOF

(71) Applicant: Mellanox Technologies Ltd., Yokneam (IL)

(72) Inventors: Adir Zevulun, Beer-Sheba (IL); Noam Rom, Moshav Shafir (IL); Nir Shmuel, Bet Shemesh (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 15/870,161

(22) Filed: Jan. 12, 2018

(51) Int. Cl.
  *H03M 7/34* (2006.01)
  *H03M 7/30* (2006.01)
  *H03M 7/40* (2006.01)

(52) U.S. Cl.
  CPC ............ *H03M 7/3086* (2013.01); *H03M 7/40* (2013.01)

(58) Field of Classification Search
  CPC .................................................. H03M 7/3086
  USPC ...................................................... 341/51–75
  See application file for complete search history.

(56) References Cited

U.S. PATENT DOCUMENTS

| | | | | |
|---|---|---|---|---|
| 4,101,881 A * | 7/1978 | De Freitas | ......... | H03H 17/0009 341/110 |
| 4,819,205 A * | 4/1989 | McRoberts | ............ | G11C 29/86 365/1 |
| 5,003,307 A | 3/1991 | Whiling et al. | | |
| 5,150,430 A * | 9/1992 | Chu | ................... | H03M 7/3086 341/51 |
| 5,197,101 A * | 3/1993 | Mok | ................ | G11B 20/00007 341/50 |
| 5,608,396 A | 3/1997 | Cheng et al. | | |
| 6,058,468 A * | 5/2000 | Funyu | ................ | G06F 11/2221 712/38 |
| 6,268,809 B1 * | 7/2001 | Saito | ................... | H03M 7/3086 341/51 |
| 7,109,895 B1 | 9/2006 | Langhammer | | |
| 8,316,235 B2 * | 11/2012 | Boehl | ................... | H04L 9/0637 380/46 |
| 9,740,493 B2 * | 8/2017 | Hughes | ..................... | G06F 9/38 |
| 2008/0109690 A1 * | 5/2008 | Park | ................ | G01R 31/31703 714/732 |
| 2010/0040020 A1 * | 2/2010 | Chen | ................ | H04W 36/0022 370/331 |

* cited by examiner

*Primary Examiner* — Lam T Mai
(74) *Attorney, Agent, or Firm* — Finnegan, Henderson, Farabow, Garrett & Dunner, LLP

(57) ABSTRACT

A hardware compression architecture including a shift register including: a plurality of sequentially coupled stages and a window stage coupled at an output end of the shift register, the shift register configured to receive an uncompressed data stream at an input end and output the uncompressed data from the window stage; a plurality of comparators each coupled to receive a data value held in a corresponding stage of the shift register and a data value held in the window stage, each of the comparators being configured to output a comparison result indicating whether the received stage value and the window stage data value match; logic, coupled to the comparators to receive the comparison results, to selectively compute one or more indexes based on the comparisons; and an encoder coupled to receive the one or more indexes and output, based on the one or more indexes, a position of a matching data value and a length of a matching sequence of data values.

10 Claims, 4 Drawing Sheets

HARDWARE DATA COMPRESSION ARCHITECTURE INCLUDING SHIFT REGISTER AND METHOD THEREOF

BACKGROUND

With an increasing proliferation of electronic data transfer between computing devices, efficient and scalable solutions to implement data compression are needed to facilitate data transfer and storage. Lempel-Ziv 77 ("LZ77") is a widely used lossless data compression algorithm. The LZ77 algorithm works by identifying redundancies, or matches, within a data stream and replacing repeating occurrences of the redundant data with references to a single copy of the data, thereby outputting a compressed data stream.

The LZ77 algorithm is often implemented using software involving a sliding window and hash structure to identify repeating occurrences of data in a data stream. Software implementations have limited ability to identify matching strings of data because they process multiple data streams in parallel. While efficient at reducing the time of data compression, these software solutions may fail to identify the longest matching sequences of data in a data stream. Such software implementations are often complex and have limited flexibility.

In view of the shortcomings of current implementations, an improved system and method for compressing data using an LZ77 or LZ77-like algorithm is needed.

SUMMARY

Disclosed embodiments provide systems and methods for implementing LZ77 lossless data compression using reconfigurable logic hardware.

Consistent with a disclosed embodiment, a hardware compression architecture includes a shift register. The shift register includes: a number of sequentially coupled stages and a window stage coupled at an output end of the shift register, the shift register configured to receive an uncompressed data stream at an input end and output the uncompressed data from the window stage; a number of comparators each coupled to receive a data value held in a corresponding stage of the shift register and a data value held in the window stage, each of the comparators being configured to output a comparison result indicating whether the received stage value and the window stage data value match; logic, coupled to the comparators to receive the comparison results, to selectively compute one or more indexes based on the comparisons; and an encoder coupled to receive the one or more indexes and output, based on the one or more indexes, a position of a matching data value and a length of a matching sequence of data values.

Consistent with another disclosed embodiment, a method for compressing data includes: receiving a stream of uncompressed data comprising a number of bytes into a shift register, wherein the shift register has one or more stages each capable of holding a byte; shifting the data stream through the shift register on successive clock cycles until a first byte of the number of bytes reaches a comparison window in a last stage of the shift register; comparing, by a plurality of comparators, the first byte in the comparison window with the byte held in each stage of the shift register; generating, based on output from the comparators, one or more indexes; outputting the one or more indexes and the uncompressed data stream.

The foregoing general description and the following detailed description are exemplary and explanatory only and are not restrictive of the claims.

BRIEF DESCRIPTION OF THE DRAWINGS

The accompanying drawings, which are incorporated in and constitute a part of this specification, illustrate several embodiments and, together with the description, serve to explain the disclosed principles. In the drawings.

DESCRIPTION OF THE EMBODIMENTS

Figure 1:
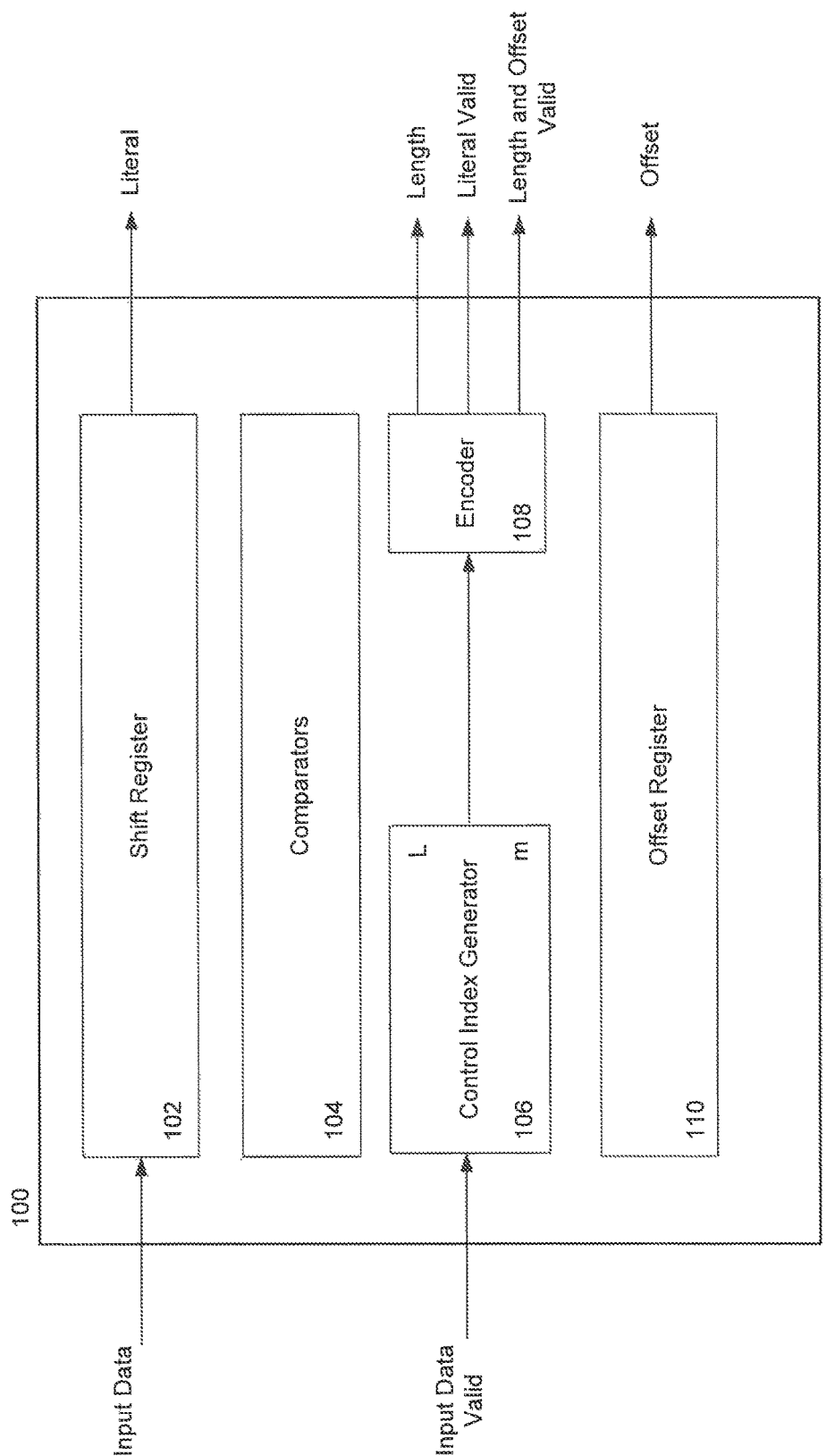
FIG. 1 is a block schematic diagram of a data compression architecture, consistent with disclosed embodiments.

The following detailed description refers to the accompanying drawings. Wherever possible, the same reference numbers are used in the drawings and the following description to refer to the same or similar parts. While several exemplary embodiments and features of the invention are described herein, modifications, adaptations and other implementations are possible, without departing from the spirit and scope of the invention. For example, substitutions, additions or modifications may be made to the components illustrated in the drawings, and the exemplary methods described herein may be modified by substituting, reordering or adding steps to the disclosed methods. Accordingly, the following detailed description does not limit the invention. Instead, the proper scope of the invention is defined by the appended claims.

Systems and methods are provided for compressing a data stream using the LZ77 lossless data compression algorithm implemented by a hardware compression architecture. In some embodiments, systems and methods are provided to implement other algorithms in the Lempel-Ziv family of algorithms. In a preferred embodiment, the LZ77 algorithm is implemented using configurable hardware logic circuitry. Some embodiments may increase the accuracy and length of matches found in a data stream by comparing the data using a serialized shift register, rather than a branching decision tree structure. Some embodiments provide a high performance hardware implementation of a data compression algorithm that is both modular and scalable. The LZ77 algorithm and LZ77-like algorithms, which are well known to the person skilled in the art, will not be described in detail herein.

Traditional compression techniques, including those using the LZ77 algorithm and LZ77-like algorithms, compress data streams in terms of data previously seen by the compression algorithm. Consistent with embodiments disclosed herein, repetitive data may be encoded via sliding window references, that are stored in the shift register, to data that have already been seen by the compression algorithm. In some embodiments, the sliding window may be implemented by random access memory (RAM) or by another storage component.

In one embodiment, a compression architecture is implemented in a field-programmable gate array (FPGA). However, it will be appreciated that the architecture can be implemented in any form of device, as required. As used herein, compression architecture refers to a hardware implementation of the LZ77, or an LZ77-like, algorithm. The LZ77 algorithm operates by detecting when a sequence of received bytes matches a sequence of bytes that has been previously received. The algorithm proceeds on a byte-by-byte basis. That is, when a first byte is received, it may be found that the same byte has been received on previous occasions. When a second byte is received, it may then be found that the sequence of the first and second bytes was received on some fraction of those previous occasions. Further bytes are then received, until the longest previously received sequence, matching that newly received sequence, is found.

In some embodiments, the compression architecture may sequentially compress a data stream. In other embodiments, the compression architecture may compress one or more data streams in parallel. Compressed data is generated based on a sequence of data that matches a longest set of bytes included in the shift register. For an instance of a matching sequence of bytes, an exemplary compressed data stream may include an offset indicating the location of the instance of the sequence of bytes and the length of the sequence. In some embodiments, one or more indexes are generated upon identifying a matching sequence of bytes in the shift register and these indexes identify the location and length of the repeated sequence of bytes, rather than storing several instances of identical data. Thus, rather than using the serialized shift register to construct an index, the compression architecture may operate directly on the output data of the shift register, comparing the output data with the data stored in the shift register.

FIG. 1 is a block diagram of an exemplary data compression architecture 100 including a shift register 102, comparators 104, a control index generator 106, an encoder 108, and an offset register 110. In some embodiments, the shift register 102 of the data compression architecture 100 receives a stream of uncompressed input data. The input data may be fed into the shift register 102 byte-by-byte.

The structure of a shift register, such as the shift register 102, is well known to a person of ordinary skill in the art. The shift register 102 includes one or more sequentially coupled stages, through which the input data is shifted, as further described below. Each stage is capable of storing a piece of data from the input data stream, e.g., one byte, and is coupled to a corresponding one of comparators 104. The shift register 102 may be configured to receive an uncompressed data stream at an input end and output the uncompressed data from a window stage. The window stage will be described further with reference to FIG. 2. As described in further detail below, the uncompressed literal, also referred to herein as output data, may be compressed by removing repeating sequences based on indexes output by encoder 108.

As the input data stream is fed through the shift register 102, the comparators 104 each receive and compare the data stored in the corresponding shift register stage and the window stage and output a comparison result indicating whether the received data matches the data stored in the window stage. The comparison result may be a Boolean value indicating a match between the received data and the window stage data (true) or indicating that the data do not match (false).

When the comparison result indicates a match, the control index generator 106 may assign a value (e.g., a Boolean value such as 1 or 0) to one or more indexes, i.e., literal valid, match valid, and offset valid, for that stage. Initially, the indexes, also referred to herein as input data valid, may be set to 0. The indexes (e.g., a match index m and a last match index L) may be used to indicate matching data in a particular stage of the shift register 102 or to indicate a matching sequence of data in more than one stage of the shift register 102. The indexes will be discussed in greater detail below. To reduce the amount of index data stored, in some embodiments, the size of each index is one bit. In other embodiments, the size of the index may be greater than one bit. As used herein, the term "index" may refer to a Boolean value held by a flip-flop, referred to hereinafter as a "flop."

The encoder 108 is coupled to receive index data from the control index generator 106. The encoder 108 may be configured to initiate a counter when matching data is identified by one of the comparators 104 and the counter may be increased during each successive clock cycle in which matching data is identified. For example, while the match index is 1, meaning matching data was identified in the input data stream, the value of the counter is increased. When a last match index and the match index both equal 1, the value of the counter, which indicates the length of the matching sequence of data, may be output by the encoder 108. When the length of the matching data stream is output, the offset register 110 outputs an offset, which is a hardcoded identification (id)/position associated with a particular stage in the shift register and stored by the offset register 110. Each stage has such a hardcoded id/position associated with it. Each time the last match of a sequence of data is found, the offset is stored and shifted with data in the shift register 102. The output data stream, offset, and length may then be stored in an off-chip database.

In some embodiments, the compression architecture 100 may be coupled with another module, for example, a Huffman encoder, to compress the data stream based on the match index and length output by the encoder 108 and on the offset output by the offset register 110. Instead of storing several sequences of repeated data, the compressed data stream may include the first instance of a sequence of data and at each subsequent instance, an offset value of the location of the first sequence of data, and a length of the sequence. For example, the sequence "abcabd" may be compressed and stored as "abc<1,2>d" Where <1,2> refers to the first position of the stream where the repeated sequence "ab" begins and the length of the repeated sequence, i.e., two characters. In other words, instead of storing the repeated sequence, the system may store the offset and length of the repeated sequence.

Figure 2:
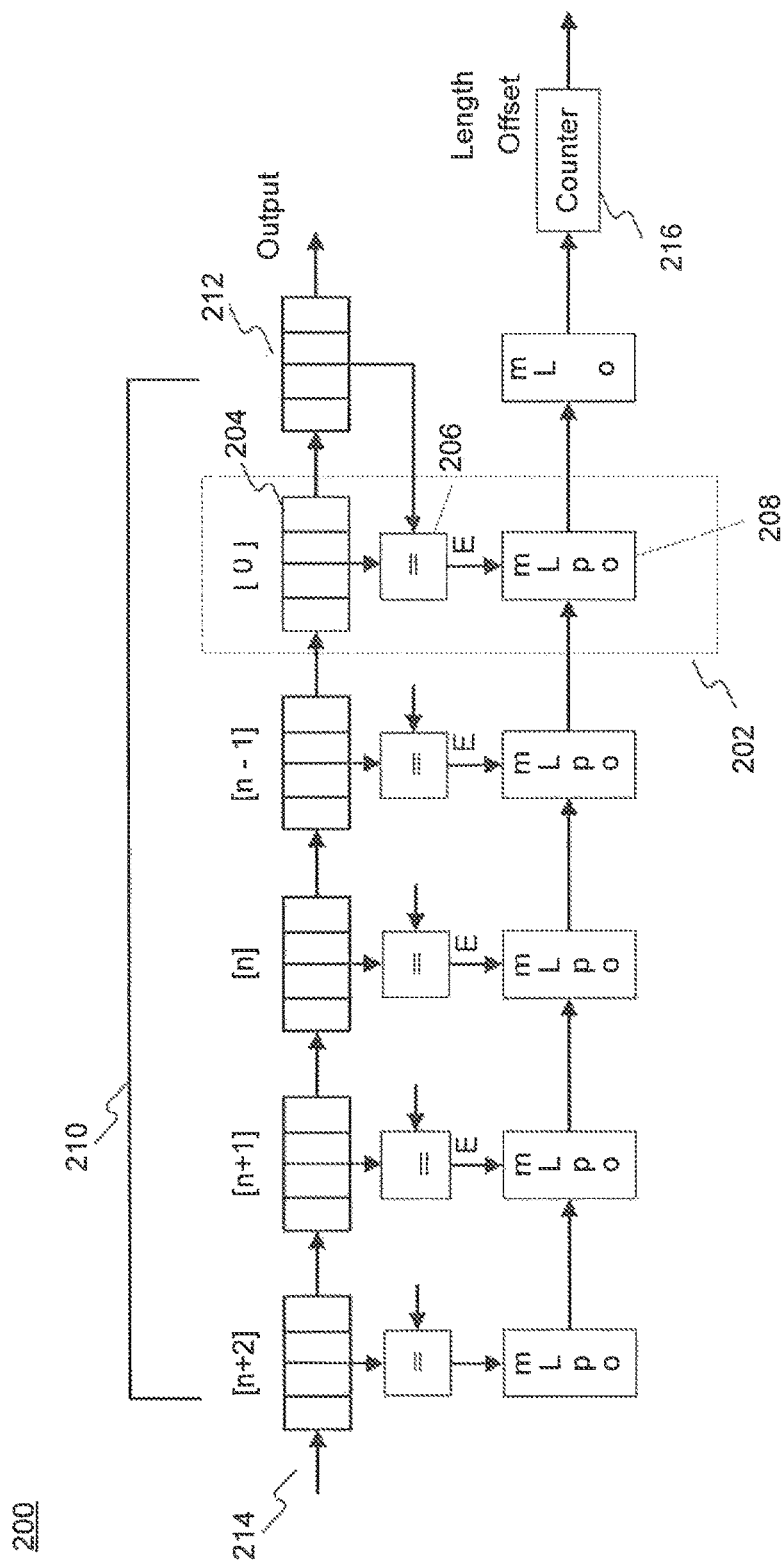
FIG. 2 is an illustration of a logic block implemented in the data compression architecture, consistent with disclosed embodiments.

FIG. 2 is an illustration of an exemplary logic block 200 that may be implemented in a data compression architecture, such as the data compression architecture 100. The logic block 200 includes one or more units 202 at positions [0], [n−1], [n], [n+1], [n+2]. Each unit 202 includes a register stage 204, a comparator 206, and a control index generator 208. In this example, a shift register 210 includes five register stages 204. In some embodiments, the shift register 210 may include less than five stages. In other embodiments, the shift register 210 may include more than five stages. The logic block 200 includes a window stage 212 as the last stage of the shift register 210. In the exemplary logic block 200, each stage 204 and window stage 212 is sized to hold one byte of data. The movement of successive bytes of input data through the window stage 212 on successive clock cycles may be referred to as a sliding window. In some embodiments, the data held by each stage 204 and window stage 212 may be more than one byte. In some embodiments, the data held by each stage 204 and the window stage 212 may be less than one byte, e.g., one bit.

A first byte of the input data 214 is fed into the first stage of the shift register 210 and shifted through the shift register 210 by one stage per clock cycle until the first byte of the input data 214 is shifted into the window stage 212. Successive bytes of the input data are fed into the first stage of the shift register 210 at each successive clock cycle. Such shifting of the input data 214 is referred to herein as Serial-In-Serial-Out (SISO). Using SISO, data compression may not begin until the first byte reaches the window stage 212. At each successive clock cycle, the byte in the window stage 212 is compared, by a comparator 206, to the byte in each stage 204 of the shift register 210. As matching bytes or sequences of bytes are detected, the repeated sequences may be removed and the uncompressed output data stream is shifted out of the window stage 212. The uncompressed output stream may later be combined with indexes output by a counter 216 that indicates the length of repeated sequences of data and an offset index, indicating the length of the repeated sequence, output by control index generators 208. The repeated sequence may be deleted and replaced with the offset location and length of the original sequence. In some embodiments, the offset register 110 may be part of control index generators 208. The offset register 110 may be shared by one or more control index generators 208. For example, if the minimum match length is four, the offset register 110 may be shared by four of the control index generators 208.

The result of comparing, by the comparator 206, the byte in the window stage 212 with each byte in the shift register 210 is applied to the control index generator 208. The control index generators 208 of logic block 200 correspond to the control index generator 106 in FIG. 1. Comparators 104 correspond to comparators 206, encoder 108 corresponds to counter 216, and shift register 102 corresponds to shift register 210. Each control index generator 208 is configured to implement one or more logic equations for respectively computing one or more indexes, as described in further detail below. Initially, each index may be assigned a Boolean value of 0.

A match index m may be generated to indicate that the comparator 206 identified a match between the byte in the window stage 212 and the byte in the stage at position [n] of the shift register 210. Index m is determined using equation (1):

$$m[n]<=E[n+1]|m[n+1] \quad (1)$$

where the symbol "|" indicates a logical OR, "<=" indicates assigning the value of index m at position [n] for the next flop state or clock cycle, and [n] and [n+1] indicate the positions of stages in the shift register 210. In this equation, E [n+1] is the output of the comparator 206 belonging to the unit 202 at position [n+1].

A previous match index p acts as a cursor and is cleared when the last match in a sequence of bytes of the input data is identified. Index p is determined using equation (2):

$$p[n]<=E[n+1]\&(\sim m[n+1]|p[n+1]|L[n]|\sim m[n]) \quad (2)$$

where the symbol "~" as used herein indicates a logical NOT, "&" indicates a logical AND, and a last match index L [n] indicates whether or not a match was found in the preceding shift register position in the previous clock cycle. Index L is determined using equation (3):

$$L[n]<=(E[n+1]\&(\sim m[n+1]|p[n]\&L[n])|L[n+1])\&(\sim E[n+2]\&L[n+1]\&p[n+1])) \quad (3)$$

Finally, an offset index o is generated to indicate the offset of the matching byte or string of matching bytes. Index o is determined using equation (4):

$$o[n]<=(E[n+1]\&\sim m[n+1])?\text{Hard\_coded\_position}:o[n+1] \quad (4)$$

where the conditional operator "?" evaluates the expression E[n+1] & ~m[n+1]) and sets o [n] to the Hard_coded_position if the expression is true and o [n] to o [n+1] if the expression is false. Hard_coded_position refers to a numerical value associated with a position of the shift register, e.g., n, n+1, etc.

At each clock cycle, indexes m, p, L, and o are calculated by the control index generator 208 based on the comparator 206 output at each register position. A counter 216, which corresponds to the encoder 108, is coupled to receive the calculated indexes and increase a counter value by 1 when m is 1. When indexes m and L both equal 1, the counter 216 may output the length of the repeated sequence of bytes and the offset value o. To generate a compressed data stream that does not contain each instance of a matching sequence of bytes, the repeating sequences of bytes are removed, and at each subsequent instance of the repeated sequence, an offset indication of the location of the first instance and a length of the repeated sequence, thereby compressing the input data stream.

Below, an exemplary series of clock cycles are described to illustrate a data compression process executed by the compression architecture 100 or exemplary logic block 200. In this example, for ease of understanding, characters will be used to represent bytes in an input data stream. In the example, the flow of characters into positions 0-10 of the shift register is from left to right. Each position corresponds to one of the units 202 containing a register stage, comparator, and control index generator. Unlike conventional implementations of LZ77 that compare input data, or in this example characters, to preceding data in the shift register, the data in the window stage 212 of the shift register 210, is compared with following data in stages at positions 0-10 of the shift register.

An original exemplary sequence of characters in an uncompressed data in a data stream is shown below in Table 1:

TABLE 1

| Orig | a | b | c | d | a | b | c | d | x | b | c | d |

For purposes of this example, the initial clock cycles, in which the input data sequentially is shifted right until a first character reaches the window stage, have been omitted. In this example, the window stage is designated as position W. An initial clock cycle at time T=0 is shown in Table 2:

TABLE 2

| T = 0 | a | b | c | d | a | b | c | d | x | b | c | d |
|---|---|---|---|---|---|---|---|---|---|---|---|---|
| E | | | | E | | | | E | | | | |
| m | | | | 0 | | | | 0 | | | | |
| L | | | | 0 | | | | 0 | | | | |
| p | | | | 0 | | | | 0 | | | | |
| o | | | | | | | | | | | | |
| Position | 10 | 9 | 8 | 7 | 6 | 5 | 4 | 3 | 2 | 1 | 0 | W |

In this clock cycle, character d, in the comparison window (far right column of table), is compared with the characters in each stage at positions 0-10 of the register. The character d in the window stage matches the characters at positions 3 and 7. The output of the comparator 206 for each position is indicated as "E." In this example, when a cell of a table is populated as E, m, L, or p, it represents a Boolean value of 1. As previously described, indexes m, L, and p are initiated with a Boolean value of 0.

At time T=1, the characters in the data stream are shifted to the right by one position and character c is shifted into the comparison window W. Indexes m, L, and p are calculated using equations (1)-(4) by referring to the previous clock cycle T=0. For example, m [6]<=E [7]|m [7]. Since at T=1, the comparator 206 identifies a match at position 7, E is true. The equation for m [6] is evaluated as m [6]<=1|0 and then m [6]<=1. This is indicated with m populated in the column for position 6. Similarly, the equation for index p is reduced to p [6]<=1 & (1|0|0|0). Index p [6] evaluates to 1, thus p is populated in the column for position 6. Similar logic is used to populate L and o. In this example, o is set to 7 and 3, which are hardcoded, numerical values corresponding with the position in the shift register at which a match was found during the previous clock cycle. Since m and L were both 1, the offset, o, was recorded. The indexes are populated for T=1 as shown below in Table 3.

TABLE 3

| T = 1 | a | a | b | c | d | a | b | c | d | x | b | c |
|---|---|---|---|---|---|---|---|---|---|---|---|---|
| E | | | E | | | | | E | | | | |
| m | | | 0 | m | | | 0 | m | | | | |
| L | | | 0 | L | | | 0 | L | | | | |
| p | | | 0 | p | | | 0 | p | | | | |
| o | | | 0 | 7 | | | 0 | 3 | | | | |
| Position | 10 | 9 | 8 | 7 | 6 | 5 | 4 | 3 | 2 | 1 | 0 | W |

At T=1, c matches the characters that have been shifted into positions 3 and 7.

Shifting the characters to the right by one position yields clock cycle T=2, shown below in Table 4.

TABLE 4

| T = 2 | a | a | a | b | c | d | a | b | c | d | x | b |
|---|---|---|---|---|---|---|---|---|---|---|---|---|
| E | | | | E | | | | E | | | | |
| m | | | | m | m | | | m | m | | | |
| L | | | | L | 0 | | | L | 0 | | | |
| p | | | | p | 0 | | | p | 0 | | | |
| o | | | | 7 | 0 | | | 3 | 0 | | | |
| Position | 10 | 9 | 8 | 7 | 6 | 5 | 4 | 3 | 2 | 1 | 0 | W |

The comparators 206 indicate matches to the character b in the window stage at positions 3 and 7. In this clock cycle, index L at position 5 is calculated as L [5]<=(E [6] & (~m [6]|p [5] & L [5])|L [6]) & (~(E [7] & L [6] & p [6])). This equation may be represented in terms of Boolean values as L [5]<=(0 & (0|0 & 0)|1) & (~(1 & 1 & 1)), which reduces further to L [5]<=(0 & 1 & 0), finally yielding L [5]<=0. Indexes m and p are calculated in a similar manner according to equations (1) and (2), respectively.

At T=3, shown in Table 5, x is in the window stage and thus the comparator 206 at each position does not indicate a match has been found.

TABLE 5

| T = 3 | a | a | a | b | c | d | a | b | c | d | x |
|---|---|---|---|---|---|---|---|---|---|---|---|
| E | | | | | | | | | | | |
| m | | | | m | m | m | | m | m | m | |
| L | | | | L | 0 | 0 | | L | 0 | 0 | |

TABLE 5-continued

| T = 3 | a | a | a | b | c | d | a | b | c | d | x |
|---|---|---|---|---|---|---|---|---|---|---|---|
| p | | | | p | 0 | 0 | | p | 0 | 0 | |
| o | | | | 7 | 0 | 0 | | 3 | 0 | 0 | |
| Position | 10 | 9 | 8 | 7 | 6 | 5 | 4 | 3 | 2 | 1 | 0 | W |

Next, shifting each character to the right and calculating indexes for T=4 yields Table 6.

TABLE 6

| T = 4 | a | a | a | a | b | c | d | a | b | c | d |
|---|---|---|---|---|---|---|---|---|---|---|---|
| E | | | | | | | E | | | | |
| m | | | | m | m | m | | m | m | m | |
| L | | | | L | 0 | 0 | | L | 0 | | |
| p | | | | | 0 | 0 | 0 | | 0 | 0 | |
| o | | | | | 7 | 0 | 0 | | 3 | 0 | |
| Position | 10 | 9 | 8 | 7 | 6 | 5 | 4 | 3 | 2 | 1 | 0 | length = 1 |

Table 6 includes the length of the matching data sequence. At T=4, the value m as true is output for character "d", and the length of the matching sequence, consisting of character "d," is one, as shown at lower right in Table 6. Thus, at each clock cycle the counter 216, or encoder 108, receives index values from the comparators 206. If m is true, the counter is increased by 1. When L is true, the counter may output the total counter value at that clock cycle. For example, in clock cycle T=5, m is true for character "c," so the counter value is increased by 1, meaning the counter now holds a value of two. At T=6, both L and m are true, and thus the counter is increased by one and the total counter value, i.e., the length of the matching data sequence, is output. At T=6, for the matching sequence of "bcd" the recorded length is three.

Figure 3:
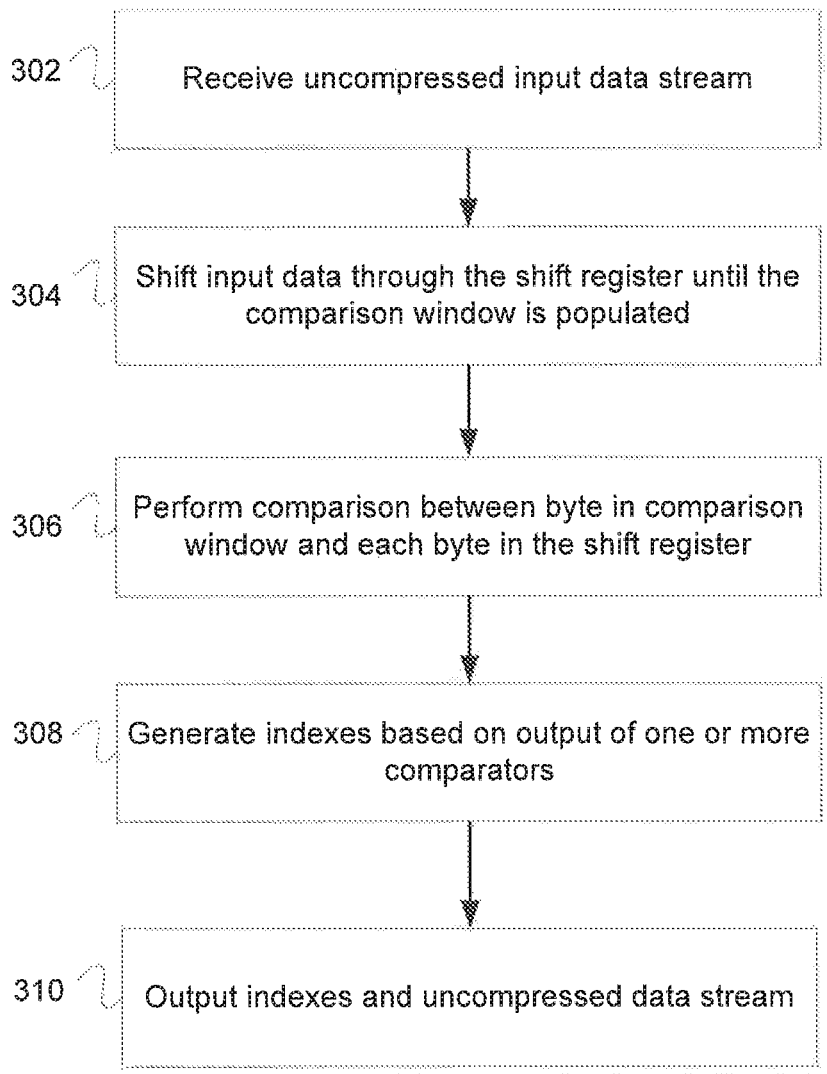
FIG. 3. is a flow chart of a data compression process, consistent with disclosed embodiments.

FIG. 3 is a flow chart of an exemplary data compression process 300 as executed by a data compression architecture, for example data compression architecture 100. At step 302, a shift register, e.g., the shift register 102 or 210, receives an uncompressed input data stream. In some embodiments, the input data stream is a sequence of bytes. As described previously, the shift register contains one or more stages capable of holding a certain amount of data. When a data stream is fed into the shift register, the stream is shifted through the register byte-by-byte on successive clock cycles until the first byte in the data stream populates a window stage, e.g., the window stage 212 (step 304). At step 306, the byte in the window stage is compared, by a comparator, e.g., the comparators 206, to the bytes in each stage of the shift register. At step 308 one or more indexes are generated based on the comparator outputs, as described above, for example, the control index generators 106 or 208. After generating the indexes, the uncompressed data stream and the indexes generated by the encoder, e.g., encoder 108 or counter 216, may be combined by another module, e.g., a Huffman coder (step 310).

Figure 4:
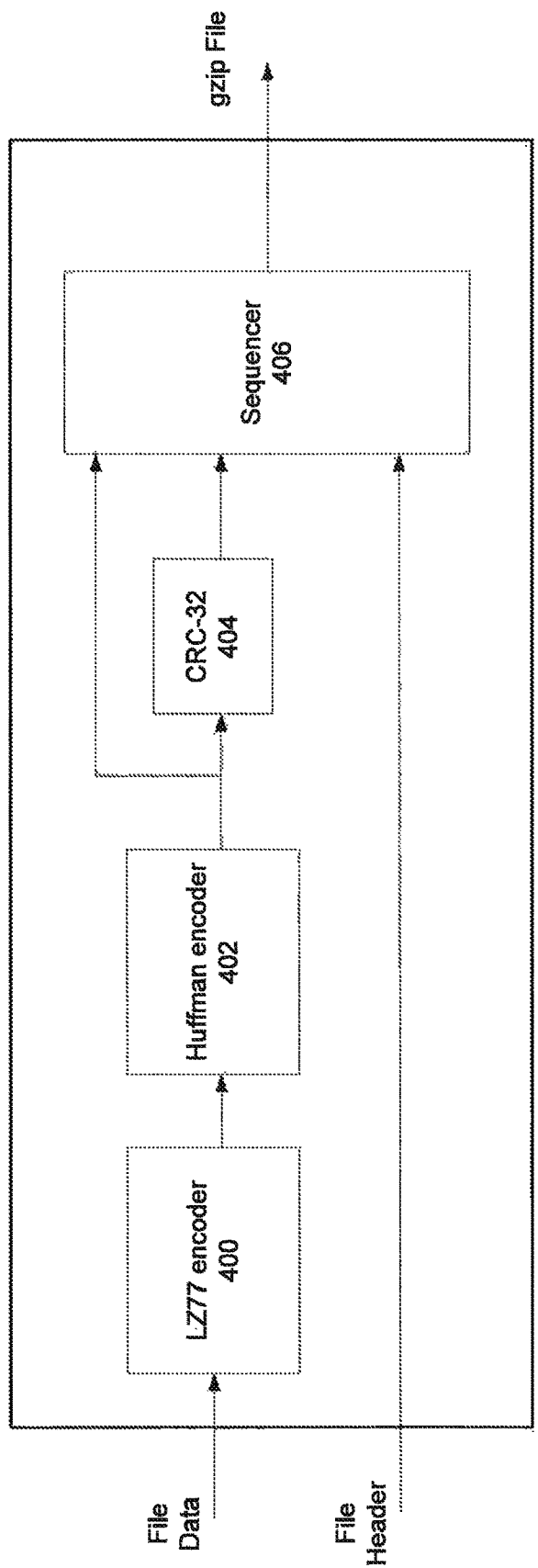
FIG. 4 is an exemplary application of the data compression architecture, consistent with disclosed embodiments.

FIG. 4 is an exemplary application of a compression architecture implementing the LZ77 algorithm as described above. This exemplary implementation may be used to compress an original file into a gzip file format. A file containing data and metadata, such as a file header, may be compressed using the LZ77 algorithm. The file data may first be processed by an LZ77 encoder 400, e.g., by the compression architecture 100 described above. A Huffman encoder 402 may be used in sequence with the LZ77 compression architecture to improve the compression rate of the hardware. The Huffman ender 402 may receive the uncompressed data stream output by the LZ77 compression architecture, the indexes generated by encoder 108 or counter 216, and the offset output by offset register 110. The output data stream of the LZ77 compression architecture 400 may be compressed by the Huffman encoder 402 using Huffman trees to store the lengths and offsets of the repeating sequences of data identified by the LZ77 compression architecture 400. The Huffman encoder 402 may remove repeated sequences of data from the uncompressed data stream and replace the sequences with an offset, indicating the position of the original sequence in the data stream, and the length of the repeated sequence.

Post-compression, the compressed file data may be fed into a CRC-32 checksum module 404 and into a sequencer 406. The sequencer 406 receives the compressed data, checksum, and file header and outputs a compressed file.

The foregoing description has been presented for purposes of illustration. It is not exhaustive and is not limited to the precise forms or embodiments disclosed. Modifications and adaptations of the embodiments will be apparent from consideration of the specification and practice of the disclosed embodiments. For example, the described implementations include hardware and software, but systems and methods consistent with the present disclosure can be implemented as hardware alone.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as non-exclusive. Further, the steps of the disclosed methods can be modified in any manner, including by reordering steps or inserting or deleting steps. It is intended, therefore, that the specification and examples be considered as exemplary only, with a true scope and spirit being indicated by the following claims and their full scope of equivalents.

What is claimed is:

1. A hardware compression architecture, comprising:
    a shift register including a plurality of sequentially coupled stages and a window stage coupled at an output end of the shift register, the shift register configured to receive an uncompressed data stream at an input end and output the uncompressed data from the window stage;
    a plurality of comparators each coupled to receive a data value held in a corresponding stage of the shift register and a data value held in the window stage, each of the comparators being configured to output a comparison result indicating whether the received stage value and the window stage data value match;
    logic, coupled to the comparators to receive the comparison results, to selectively compute one or more indexes based on the comparisons; and
    an encoder coupled to receive the one or more indexes and output, based on the one or more indexes, a position of a matching data value and a length of a matching sequence of data values.

2. The hardware compression architecture of claim 1, wherein the logic is configured to output at least one of the indexes to indicate a length of a sequence of matching data.

3. The hardware compression architecture of claim 1, wherein the logic is configured to output at least one of the indexes as an offset identifying a location of a first instance of matching data.

4. A computer-implemented method for compressing data including:
    receiving a stream of uncompressed data comprising a plurality of bytes into a shift register, wherein the shift register has one or more stages each capable of holding a byte;
    shifting the data stream through the shift register on successive clock cycles until a first byte of the plurality of bytes reaches a comparison window in a last stage of the shift register;
    comparing, by a plurality of comparators, the first byte in the comparison window with the byte held in each stage of the shift register;
    generating, based on output from the comparators, one or more indexes;
    outputting the one or more indexes and the uncompressed data stream.

5. The method of claim 4, wherein comparing the first byte with the byte held in each stage of the shift register includes determining if the first byte is equal to the byte in a first stage of the shift register.

6. The method of claim 4, wherein output from the comparator comprises a Boolean data type.

7. The method of claim 4, wherein at least one index of the one or more indexes indicates a length of a sequence of matching bytes.

8. The method of claim 4, wherein at least one index of the one or more indexes comprises an offset identifying a location of a first instance of matching data.

9. The method of claim 4, wherein at least one index of the one or more indexes indicates a match between the first byte and the byte in the first stage of the shift register.

10. The method of claim 8, wherein combining the one or more indexes with the uncompressed data stream comprises replacing matching bytes and storing the offset.

* * * * *